(12) United States Patent
Falk et al.

(10) Patent No.: US 6,518,850 B1
(45) Date of Patent: Feb. 11, 2003

(54) FERROELECTRIC MODULATOR

(75) Inventors: Kent Olof Falk, Mölnlycke (SE); Ragnar Arvidsson, Västra Frölunda (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/510,769

(22) Filed: Feb. 23, 2000

(30) Foreign Application Priority Data

Feb. 24, 1999 (SE) ............................... 9900646

(51) Int. Cl.[7] ............................. H03C 3/00; H03C 7/02
(52) U.S. Cl. ...................... 332/144; 333/161; 455/111
(58) Field of Search ...................... 332/144; 333/161; 455/111

(56) References Cited

U.S. PATENT DOCUMENTS

| | | |
|---|---|---|
| 4,445,098 A | 4/1984 | Sharon et al. |
| 4,506,234 A | 3/1985 | Vittoria |
| 5,210,775 A | 5/1993 | Takahara et al. |
| 5,278,924 A | 1/1994 | Schaffner |
| 5,334,958 A * | 8/1994 | Babbitt et al. .............. 333/156 |

FOREIGN PATENT DOCUMENTS

| | | |
|---|---|---|
| EP | 0 472 404 A2 | 2/1992 |
| SU | 1193738 | 11/1985 |
| SU | 1352562 | 11/1987 |
| WO | WO 9413028 A1 | 6/1994 |

OTHER PUBLICATIONS

Gjervaldsaeter, P., International Search Report, International App. No. PCT/SE00/00297, Aug. 17, 2000, pp. 14.
Gjervaldsaeter, P.; International–Type Search Report; Search Request No. SE99/00201; Dec. 20, 1999; pp. 1–4.

* cited by examiner

*Primary Examiner*—Arnold Kinkead
(74) *Attorney, Agent, or Firm*—Jenkens & Gilchrist, P.C.

(57) ABSTRACT

A method of modulating a microwave carrier and a modulating device are disclosed make it possible directly, onto a microwave carrier right at the operating frequency, to modulate an information signal from a digital bit-stream without the use of a conventional up-conversion chain or frequency multiplication after the modulation. A fast ferroelectric element is provided and operated with a variable voltage source controlled directly by the digital bit-stream representing the information to be modulated. The element can either be positioned between a microwave power amplifier and a radiating antenna device or even close in front of the antenna such that a collimated beam must pass through the modulation device. The element will then be able to introduce phase modulation of a passing microwave carrier.

4 Claims, 3 Drawing Sheets

FERROELECTRIC MODULATOR

TECHNICAL FIELD

The present invention relates to a fast radio frequency modulator and more exactly to a method and an arrangement for modulating a radio frequency signal by means of an arrangement utilizing a ferroelectric device.

BACKGROUND

In microwave applications for communication there is always a need for a modulation system which allows a fast information transfer. The modulated signal may basically be either phase/frequency modulated (PM/FM) or amplitude modulated (AM). In the conventional way this is solved by generating and modulating a carrier at a lower frequency and by means of some process transfer this modulated lower frequency to a radio wave at a much higher frequency. This transfer process for the actual modulation information may be obtained for instance by a multiplication of the modulated carrier and a microwave carrier in a mixer circuitry, whereby the desired frequency product is either the sum or the difference of the two carriers. However this conventional method calls for additional filtering to exclude the unwanted product frequency as well as the initial carrier frequencies.

Yet another conventional method would be to just frequency multiply the modulated carrier itself up to the desired frequency. The frequency multiplication is more often used in combination with phase modulation but still this method will be considered to have a number of disadvantages regarding for instance stability, bandwidth etc.

In an international application WO94/13028 is described different ferroelectric films such as $SrTiO_3$, $Pb(Sr,Ti)O_3$, $Sr_xBa_{1-x}TiO_3$, which provide a tunable dielectric constant by variation of a voltage applied across the ferroelectric film. Because of the intrinsically low losses at high frequencies, these materials can be implemented in a variety of microwave components. This document is hereby incorporated by reference.

When investigating the state of the art several documents are found discussing for instance phase-shifting. A microwave phase-shifter, which contains a transmission line section including a ferroelectric material on a dielectric backing is for instance described in a Russian document SU 1352562. This phase shifter further contains a second transmission line section electromagnetically coupled to the first section and having absorbent elements at the ends, or on the coupling part, of the second line section. However, it is claimed that various combinations of amplitude and phase modulation may be obtained, but the document neither indicates any detailed practically working modulator utilizing such a ferroelectric material, nor is any suitable material for such a microwave operation disclosed.

Another Russian document, SU 1193738, discloses a microwave phase shifting network which includes a dielectric substrate coated by a ferroelectric film and which network has a complementary transmission line consisting of three metal strips separated by gaps. It is stated that the various combinations of the amplitude and phase modulation can be obtained to compensate a parasitic amplitude modulation, and also the microwave amplitude may be effectively controlled. However, the only feature given is that the phase-shifting device has one gap at least two times larger than the second gap in the complementary transmission line.

According to a third Russian document, SU 1030889, the phase-shifting network has its phase shifting range extended while its matching capability is improved up to several octaves, its physical size is small and its operational speed is improved, for use in phase modulation and commutation of measurement and communication technology. According to the title of the document it concerns UHF band radio communication, but not microwave applications. The main feature of this disclosure is that the device has recesses in mutually opposing metal strips forming periodic structures.

A document, U.S. Pat. No. 4,445,098, discloses a method and an apparatus for a fast switching dual-toroid microwave phase shifter. The document describes a phase-shifter comprising a linearizing PROM, a DAC and an amplifier connected to a ferrite phase-shifter. The PROM constitutes a programmable memory containing a unique linearizing function for the phase shifter. However a phase-shifter utilizing ferromagnetism will still be considerably slow and not be found very practical for phase modulation of fast bit-streams on to a carrier.

Finally a U.S. Pat. No. 5,210,775 discloses a π/4 shift QPSK-modulator and communication apparatus for receiving digital signals and outputting a modulated signal in accordance with each of the two inputted digital signals representing a quadrature signal.

Therefore there is still a demand for a device being able to modulate a microwave signal from a fast digital bit-stream of the order hundreds of MHz and above, without the need for a conventional frequency up-conversion, in order to obtain a better reliability and stability than a conventional solution will offer, even at a lower cost.

SUMMARY

Thus, the object of the present invention is to make possible directly, onto a microwave carrier right at the operating frequency, to modulate an information signal from a digital bit-stream without the use of a conventional up-conversion chain or frequency multiplication after the modulation. According to the invention a fast ferroelectric phase alternator is provided and operated with a variable voltage source controlled directly by the digital bit-stream representing the information to be modulated.

The method of the present invention is set forth by the independent claims 1 and 4, and further steps are set forth by the dependent claims 2–3 and 5–8.

An arrangement for modulating a microwave carrier by a fast digital bit-stream according to the present invention is set forth by the independent claims 9 and 12 while further embodiments of the arrangement are embraced by the dependent claims 10–11 and to 13–16.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
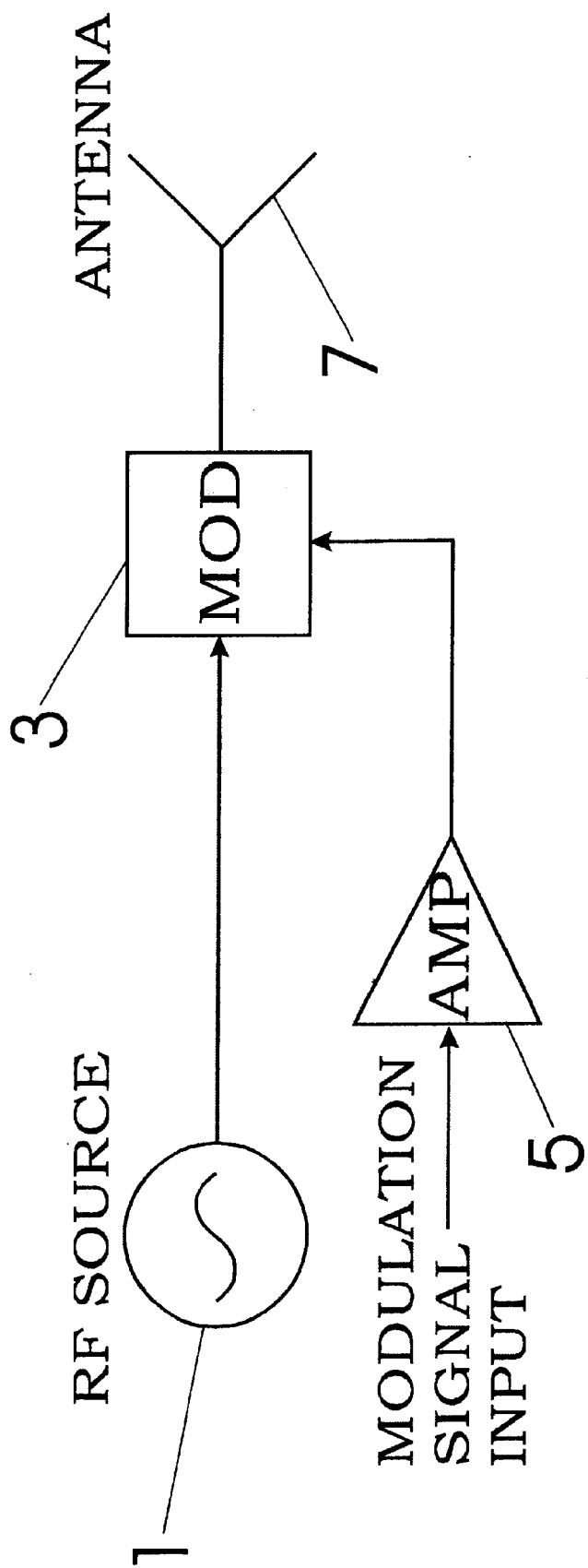
FIG. 1 illustrates a basic embodiment of a method and an arrangement for direct modulation of a microwave carrier in accordance to the present invention.

According to the method of the present invention and an arrangement according to the present invention digital modulation of a microwave transmitter is applied directly onto the microwave carrier transmitted. In FIG. 1 is demonstrated a basic diagram illustrating the method as well as the basic arrangement. The microwave frequency is generated with the carrier frequency to be transmitted by means of a microwave radio frequency source 1. The microwave radio-frequency source 1 of FIG. 1 includes the necessary power amplification for obtaining a desired microwave carrier power level. A modulator device 3 is positioned between the radio frequency source 1 and an antenna device for radiating microwave power. A digital signal formed by a sequence of pulses, which in turn represent binary values of zero and binary values of one, is applied to an amplifier device 5 to obtain the necessary alternating voltage level representing this binary sequence. The amplifier device 5 applies this alternating voltage level across the modulator device 3. The modulator device consists in an illustrative embodiment of a plate through which the microwave carrier power is passed on its way to the radiating antenna device 7. In another embodiment the modulator plate may be positioned in front of a radiator device. The modulator device plate comprises a thin film of ferroelectric material, which also may be provided with a high temperature superconductor (HTSC) material for obtaining low losses and impedance matching to the environment. According to the state of the art a ferroelectric material, e.g., SrTiO3, provides a substrate for a deposited HTSC material, such as $YBa_2CU_3O_{7-8}$ (YBCO) or Tl—Ba—Ca—Cu—O (TBCCO) to thereby create a suitable plate for the modulator device 3. The modulator plate is further provided with paired electrodes to apply an alternating voltage signal level across the ferroelectric plate for achieving a phase shift of the microwave carrier passing through the plate.

The created ferroelectric plate provides a very high frequency response to the alternating voltage level applied across the modulator device 3 and will in this mode act as a very fast phase modulator of the applied microwave carrier. This operation mode will be ideal for direct transfer of digital information to the microwave carrier. Consequently by controlling this alternating voltage level according to the required phase modulation a fast direct modulation of the microwave carrier will result. In the basic embodiment according to the method a well-defined phase modulation (PM) will be achieved for the one-bit digital bit-stream to in this case basically provide simple PSK symbols to be demodulated by a receiver of the microwave modulated in this way.

Figure 2:
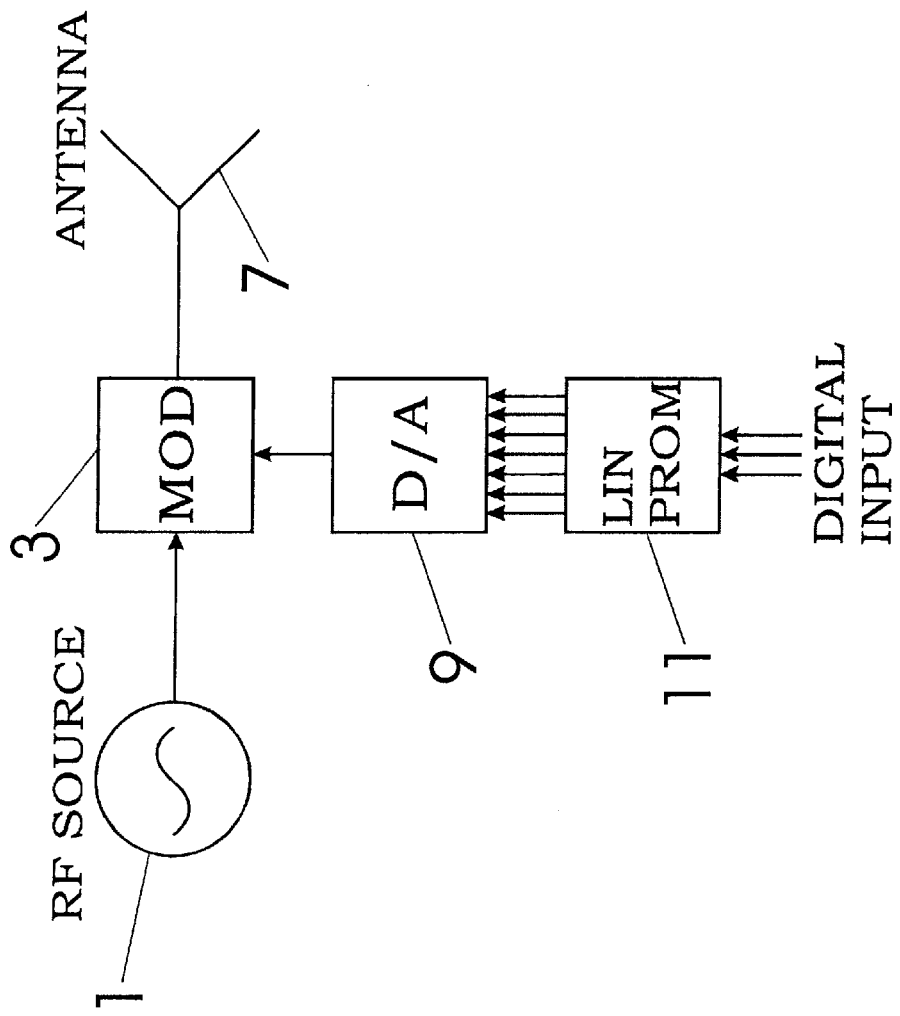
FIG. 2 illustrates an additional embodiment of the method and the arrangement for direct modulation of a microwave carrier further incorporating a linearization step.

In FIG. 2 is demonstrated a further embodiment of the present inventive method comprising addition of a linearizing circuitry, which in turn controls a digital-to-analog converter 9 including the necessary amplifier for creating the variable voltage applied to the ferroelectric modulator. In an illustrative embodiment utilizing the present inventive method the linearizing circuitry constitutes a programmable read only memory 11, a PROM or an EPROM/EEPROM, of a type well known to a person skilled in the art of digital techniques. In a practical case a shift register may be connected to the digital bit stream. This shift register then outputs the bits forming the individual PSK symbols to the modulator device.

Consequently, a modulator device utilizing the present inventive method will provide a simple and low cost device for obtaining a reliable and stable modulation directly onto a microwave carrier at the operating frequency. No up-conversion by mixers or frequency multiplication after the modulation stage need to be used for generating a modulation of the information to be transferred, for instance, over a microwave link. The voltage controlled modulator plate of ferroelectric material is simply positioned at a strategic position in the feeding line to the antenna. In an additional embodiment of the present invention the modulating plate 3 may even be positioned very close in front of the antenna aperture, e.g. in a horn antenna for a simple realization of the modulation of a digital bit stream onto a radiated carrier. It should be noted that the modulating element 3 does not act as a lens, and does generally not influence on the shape of the beam. However, a ferroelectric device might even constitute a combination of a modulating device and a lens, by also considering techniques utilizing ferroelectric materials as a lens device by adding two voltage controlled conducting grids to a ferroelectric plate according to the state of the art.

Figure 3:
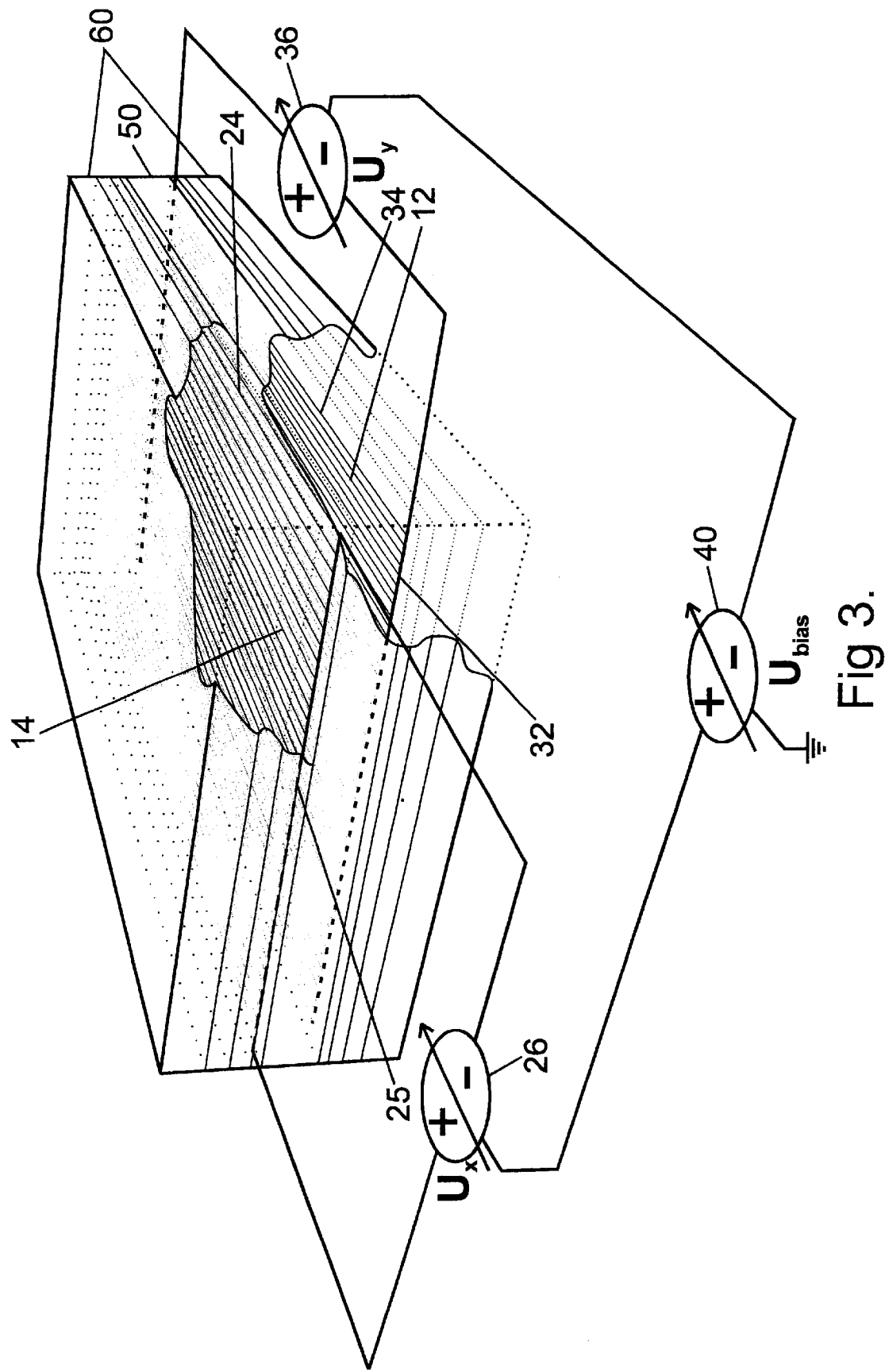
FIG. 3 illustrates an embodiment of a ferroelectric lens for direct modulation of a microwave carrier and a simultaneous control of the radiation lobe direction.

FIG. 3 demonstrates a structure of a continuous scanning ferroelectric lens. The lens comprises a ferroelectric plate 50 provided on each side with a respective wire grid 12 and 14. The grid 14 contains highly conducting wires 24 fed by means of a resistive wire 25. The grid 12 contains resistive wires 34 fed by highly conductive wires 32 at their ends. The wires 24, 34 of the two sets of wires are running parallel to each other. By creating a voltage gradient over the respective grid affecting the dielectric constant of the plate 50 this arrangement will be able to control the outgoing direction of a radiation passing the lens. This radiation lobe is controlled in a plane perpendicular to the plate 50 and to the direction of the grid wires by means of a voltage $U_x$. In a similar way the radiation lobe will be controlled in a plane perpendicular to the plate 50 but parallel to the direction of the grid wires by means of a voltage $U_y$. In order to obtain low losses and no change of E field polarity when sweeping the voltages $U_x$ and $U_y$, a bias source 40 ($U_{bias}$) of the order 5 to 10 kV is normally applied between the two voltage sources 26 and 36. The symbols shown simply indicate that this biasing is connected within the voltage range of the variable sources, preferably at a center point. In a similar manner it is indicated by the grounding at the symbol of the biasing source how the device of the illustrative embodiment is referenced to a system ground.

To achieve an impedance matching to the surroundings, it will in most of the cases be necessary to cover the surface of the lens element 50 on one side or on both sides with a transformer 60. This transformer changes, step by step or continuously, the impedance level such that the reflections, when the propagating wave enters or leaves the ferroelectric plate 50, become low enough within the operative frequency range. Placing a ferroelectric lens with a modulator device 3 in front of the radiator a combined arrangement is achieved. In this case the lens with a ferroelectric modulator device 3 controlled according to FIG. 1 a phase modulation of a passing microwave carrier can be obtained simultaneously as the angle of radiation can be controlled by the lens arrangement.

The modulator device 3 may in an illustrative embodiment have a corresponding build up as the lens of FIG. 3. A difference is that the modulator device 3 is provided with two equal parallel grids of highly conducting wires which are fed at one end by another highly conducting terminal and the controlling voltage is then connected to the two grid terminals such that the potential difference is acting over the entire ferroelectric plate constituting the modulator device. To also obtain less losses for a modulator element 3 in a position in the feeding line to the antenna similar impedance matching transformers to the surroundings may be used for the modulator element as for the lens device described. It should also be noted that if the modulator device is combined with a lens device the direction of all grid wires have to be parallel. In a preferred embodiment the lens element in front of the radiator device is simultaneously used as a modulator device by applying the variable voltage representing the information signal superimposed on the biasing voltage. In this case only the two original parallel grids 12 and 14 of the lens device are needed with one ferroelectric plate 50. Besides, such an arrangement will also introduce less carrier signal losses.

One of the dominant advantages of the present invention is that a high power microwave source can be used in front of the modulator device to thereby directly obtaining the desired microwave power of the transmitted signal without the use of any subsequent amplification. However it will be obvious to a person skilled in the art that an additional amplifier may be still inserted after the modulating element if desired. The modulator device may be positioned at a suitable position in a wave guide feeding the microwave radiation device, or it can even be positioned in front of a well collimated beam from a microwave antenna, e.g. a horn or any other such suitable radiation device well known by a person skilled in the art. Another feature is the simple circuitry needed for obtaining the desired modulation. In the description PSK type modulation has been discussed for simplicity but a person skilled in the art will realize that a multitude of other well known modulation principles, e.g. QPSK, also can be achieved by the present method and arrangement.

It will be understood by those skilled in the art that various modifications and changes may be made to the present invention without departure from the scope thereof, which is defined by the appended claims.

What is claimed is:

1. A method for a direct modulation of a microwave carrier from a fast digital bit-stream, comprising the steps of:

generating a microwave carrier having a desired power level at a desired operating frequency;

applying the generated microwave power to a radiator device;

applying said microwave carrier from said radiator device to an input side of a ferroelectric element to be applied as a modulating device by inserting said ferroelectric element close in front of said radiator device;

operating said ferroelectric element by means of a variable voltage source, said variable voltage source being controlled by said fast digital bit-stream representing the information to be modulated, said variable voltage source thereby generating an alternating voltage level representing said digital bit stream;

outputting a resulting phase modulated microwave carrier signal from said ferroelectric element to radiate a microwave provided with phase modulated information;

controlling said alternating voltage level according to a requested phase modulation of said microwave carrier passing ferroelectric element for obtaining a desired modulation phase deviation of the microwave carrier transmitted;

combining said ferroelectric element with a ferroelectric lens arrangement for further controlling direction of a radiated microwave.

2. A method for a direct modulation of a microwave carrier from a fast digital bit-stream, comprising the steps of:

generating a microwave carrier having a desired power level at a desired operating frequency;

applying the generated microwave power to a radiator device;

applying said microwave carrier from said radiator device to an input side of a ferroelectric element to be applied as a modulating device by inserting said ferroelectric element close in front of said radiator device;

operating said ferroelectric element by means of a variable voltage source, said variable voltage source being controlled by said fast digital bit-stream representing the information to be modulated, said variable voltage source thereby generating an alternating voltage level representing said digital bit stream;

outputting a resulting phase modulated microwave carrier signal from said ferroelectric element to radiate a microwave provided with phase modulated information;

controlling said alternating voltage level according to a requested phase modulation of said microwave carrier passing ferroelectric element for obtaining a desired modulation phase deviation of the microwave carrier transmitted;

a variable voltage source controlled by a digital bit-stream, said variable voltage source controlling dielectric properties of said ferroelectric element for applying phase modulation to a radiated microwave carrier passing said ferroelectric element.

3. An arrangement for direct modulation of a microwave by an information signal, comprising:

a microwave generator delivering a desired microwave carrier power level;

a microwave radiating device for radiating the power level generated by said microwave generator;

a ferroelectric element positioned close in front of said microwave radiating device;

a variable voltage source controlled by a digital bit-stream, said variable voltage source controlling dielectric properties of said ferroelectric element for applying phase modulation to a radiated microwave carrier passing said ferroelectric element;

wherein said ferroelectric element in front of said radiating device further is combined with a ferroelectric lens controlling a radiation lobe of said microwave radiating device.

4. The arrangement according to claim 3, wherein said ferroelectric lens also operates as modulating element by applying said controlled variable voltage level superimposed on a biasing voltage.

* * * * *